(12) United States Patent
Goto et al.

(10) Patent No.: US 6,215,178 B1
(45) Date of Patent: Apr. 10, 2001

(54) SEMICONDUCTOR DEVICE

(75) Inventors: Masao Goto, Oita-ken; Yuji Fukuzawa, Yokohama, both of (JP)

(73) Assignee: Kabushiki Kaisha Toshiba, Kawasaki (JP)

( * ) Notice: Subject to any disclaimer, the term of this patent is extended or adjusted under 35 U.S.C. 154(b) by 0 days.

(21) Appl. No.: 09/181,870

(22) Filed: Oct. 29, 1998

(30) Foreign Application Priority Data

Oct. 31, 1997 (JP) .................................................. 9-301271

(51) Int. Cl.[7] .................................................. H01L 23/495
(52) U.S. Cl. .................................................. 257/668; 257/700
(58) Field of Search .................................................. 257/668, 700, 257/701, 666

(56) References Cited

U.S. PATENT DOCUMENTS

| | | | |
|---|---|---|---|
| 5,585,666 | * 12/1996 | Fujimori | 257/668 |
| 5,744,859 | * 4/1998 | Ouchida | 257/668 |
| 6,084,291 | * 7/2000 | Fujimori | 257/668 |

* cited by examiner

Primary Examiner—Roy Potter
(74) Attorney, Agent, or Firm—Finnegan, Henderson, Farabow, Garrett & Dunner, L.L.P.

(57) ABSTRACT

The semiconductor device comprises an insulating film having a device hole; inner leads disposed on one main face of the insulating film; a semiconductor element, which is mounted on the insulating film and connected to the ends of the inner leads; and a resin-encapsulating layer for covering such connections and the like, wherein the device hole of the insulating film has a flat shape externally protruded in the neighborhood of the middle on the short side, and a length of the long side containing the projections is larger than the corresponding length of the semiconductor chip. The expansion of the resin-encapsulating layer coated on the insulating film has a length on the short side of the semiconductor element larger than that on the long side. In a semiconductor device having the UNT structure in particular, a strength of adhesive between the resin-encapsulating layer and the insulating film on the short sides of the semiconductor chip is improved, a crack is prevented from being caused, and high reliability in connection can be obtained.

9 Claims, 5 Drawing Sheets

SEMICONDUCTOR DEVICE

BACKGROUND OF THE INVENTION

1. Field of the Invention

The present invention relates to a semiconductor device, and more particularly to a semiconductor device suitable as a driver LSI for a liquid crystal display (LCD).

2. Description of the Related Art

Conventionally, in order to reduce electronic modules or devices in size and cost and simplify their configurations, there is a known TCP (tape carrier package) which has a carrier tape having a device hole and wiring such as inner leads, a semiconductor element (e.g., a semiconductor chip) mounted on and electrically connected to the carrier tape, and the resin-encapsulating layer to seal the connecting portion.

Especially, for the LCD which is a thin and low-power consuming display, TCP which has a quite slim semiconductor chip mounted on a tape having a device hole smaller than the chip, and is configured to be connectable in two directions on the long sides of the semiconductor chip, is used as a driver LSI. Such TCP, which is an ultra narrow TCP, will be called UNT hereinafter.

FIG. 8A and FIG. 8B show the structure of the UNT. In the drawings, reference numeral 1 shows a film carrier tape made of polyimide resin or the like. This tape has long and narrow rectangular device holes 2. The device holes 2 are formed to have long sides and short sides, which are smaller than those of the semiconductor chip to be described afterward. The short sides are arranged in parallel with the longitudinal direction (indicated by the arrow) of the carrier tape 1. One face of the carrier tape 1 has wiring such as a group of inner leads (not shown). Each inner lead has its leading ends protruded from two long sides of the device hole 2.

Reference numeral 3 shows the semiconductor chip mounted in a device hole region of the carrier tape 1. The semiconductor chip 3 is electrically connected to the inner leads through bumps of Au or the like. Furthermore, a resin-encapsulating layer 4 of epoxy resin or the like is externally formed on the surface of the semiconductor chip 3 where electrode pads are formed and the connections of the semiconductor chip 3 and the inner leads. The resin-encapsulating layer 4 is formed by a method for dispensing to apply a liquid encapsulating resin by a dispenser for example. Reference numeral 5 shows a dummy inner lead (hereinafter called the dummy lead) with its leading ends protruded from the short sides of the device holes 2. The dummy lead 5 is connected to the electrode pad of the semiconductor chip 3 so to serve to mechanically support and fix the semiconductor chip 3.

The conventional UNT configured as described above, however, has the device hole 2 with its long and short sides made shorter than the corresponding sides of the semiconductor chip 3, allowing substantially no gap between the semiconductor chip 3 and the inner peripheral surface of the device hole 2. Accordingly, the encapsulating resin dispensed onto the electrode pad-formed surface of the semiconductor chip 3, flows to the lower face (opposite from the wiring-formed face) of the carrier tape 1 in such a small amount (expanding length) of about 200 $\mu$m from the end faces of the semiconductor chip 3 on the long and short sides. Therefore, a strength of adhesive of the resin-encapsulating layer 4 on the short sides of the semiconductor chip 3 is insufficient.

Specifically, such a semiconductor device has the carrier tape 1 die-cut on the side slightly outside of the resin-encapsulating layer 4, bent or folded into an appropriate shape and mounted on a mother board. Therefore, the resin-encapsulating layer 4 is required to have a strength of adhesive of at least 10 N (Newton) per unit area (m$^2$) against the carrier tape 1.

But, in the conventional UNT, the resin-encapsulating layer 4 formed on the short sides of the semiconductor chip 3 has such a low strength of adhesive of 2 N/m$^2$ that the resin-encapsulating layer 4 is cracked in the steps of die-cutting and folding of the carrier tape 1. As a result, the inner leads and the semiconductor chip 3 may have a defective connection or a breakage in the inner leads.

SUMMARY OF THE INVENTION

The invention was completed to remedy the problems described above. And its object includes that a strength of adhesive of the resin-encapsulating layer formed on the short sides of a semiconductor chip is improved in a semiconductor device having the UNT structure, and a crack is prevented from being caused.

Specifically, a semiconductor device of the invention comprises an insulating film having a device hole; inner leads, which are disposed on one main face of the insulating film with their leading ends protruded to the device hole; a semiconductor element, which is mounted on the device hole region of the insulating film and has its electrode pads electrically connected to the ends of the inner leads; and a resin-encapsulating layer for covering the semiconductor element, the inner leads and the connection of the semiconductor element and the inner lead, wherein a length of the device hole along its long side is determined to be larger than the corresponding long side of the semiconductor element, and the resin-encapsulating layer coated on the insulating film is largely expanded externally on the short side of the device hole as compared with that on the long side.

Such a semiconductor device is UNT and characterized in that a length of the device hole along the long side only is larger than that of the long side of the semiconductor element, and a length along the short side is smaller than that along the corresponding short side of the semiconductor element.

The insulating film used for the semiconductor device of the invention includes a polyimide resin film for example. Generally, the insulating film is desired to have a thickness of about 50 to 125 $\mu$m depending on a type, shape and size of the semiconductor device.

The invention can have the device hole having a flat shape with a projection formed to externally project in the neighborhood of the middle on the short side. This flat shape of the projection of the device hole can be a triangle or square with a part or the full length of the short side of the device hole as one side, or a semicircular or arc with a part or the full length of the short side of the device hole as the diameter or chord thereof, or a shape similar to such shapes.

The projection on the short side of the device hole has desirably a projected length of 200 to 300 μm, and more preferably 100 to 300 μm. It is desirable that an expanded length of the resin-encapsulating layer formed on the other face of the insulating film through the projections of the device hole is desirably adjusted to fall in a range of 500 to 1,000 μm (1 mm) on the short side of the semiconductor element. When the projected length on the short side of the device hole is less than 200 μm, the expanded length of the resin-encapsulating layer is less than 500 μm, resulting in insufficient strength of adhesive between the resin-encapsulating layer and the insulating film on the short side of the semiconductor element. When the projected length on the short side of the device hole exceeds 300 μm, the expanded length of the resin-encapsulating layer is larger than 1 mm. Even when the expanded length is larger than 1 mm, additional improvement of the strength of adhesive is not expected, but workability such as die-cutting of the film is degraded.

Thus, the semiconductor device of the invention has a larger length of the device hole along the long side than the corresponding length of the semiconductor element so to form a gap between the inner peripheral surface of the device hole and the semiconductor chip on the short side of the semiconductor element. Therefore, when the resin-encapsulating layer is formed by dispensing a liquid resin, the liquid resin can flow in a sufficient amount through the gap on the short side to reach the other face of the insulating film. Thus, the resin-encapsulating layer to be formed on the other face of the insulating film by flowing as described is formed to largely expand externally on the short side of the semiconductor element and the device hole as compared with that on the long side, so that a strength of adhesive between the resin-encapsulating layer and the insulating film is improved extensively. Therefore, the resin-encapsulating layer is not cracked in the steps of die-cutting and folding in order to mount on the mother board, and the semiconductor device having high reliability in connecting or the like can be obtained.

DETAILED DESCRIPTION OF THE PREFERRED EMBODIMENTS

Preferred embodiments of the invention will be described with reference to the accompanying drawings.
Embodiment 1

Figure 1:
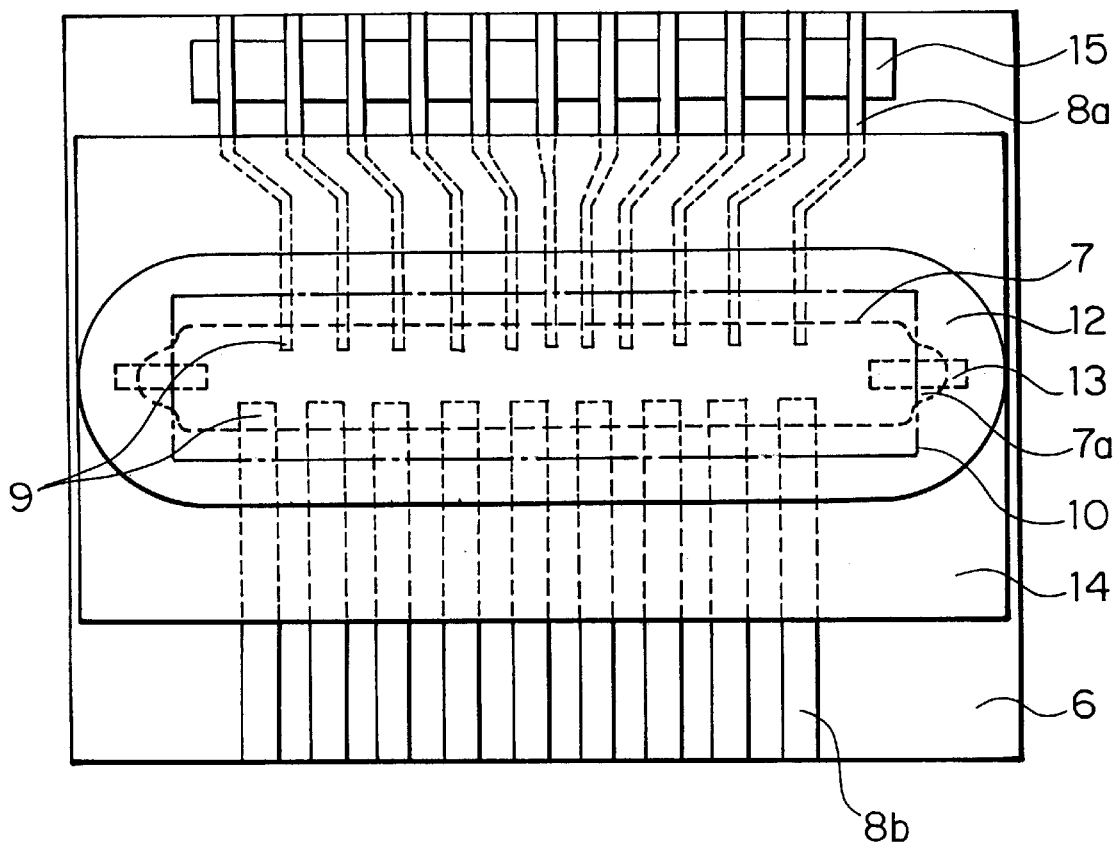
FIG. 1 is a plan view schematically showing the structure of UNT according to a first embodiment of the invention;.
Figure 2:
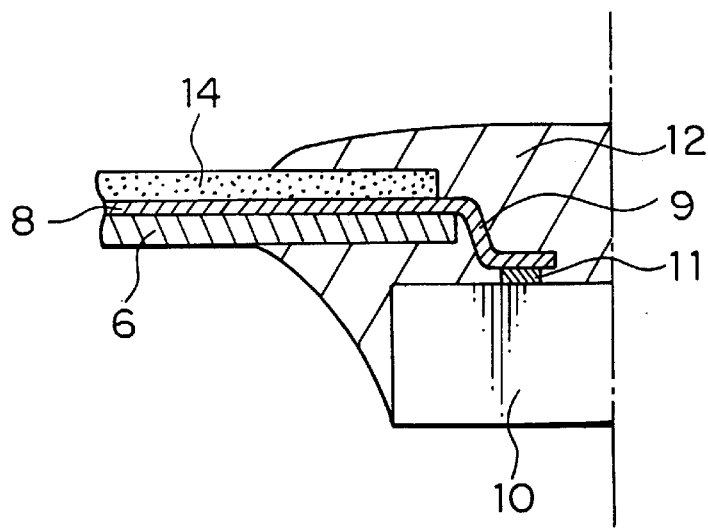
FIG. 2 is a sectional view showing the structure of a connection between a semiconductor chip and an inner lead of the first embodiment.
Figure 3:
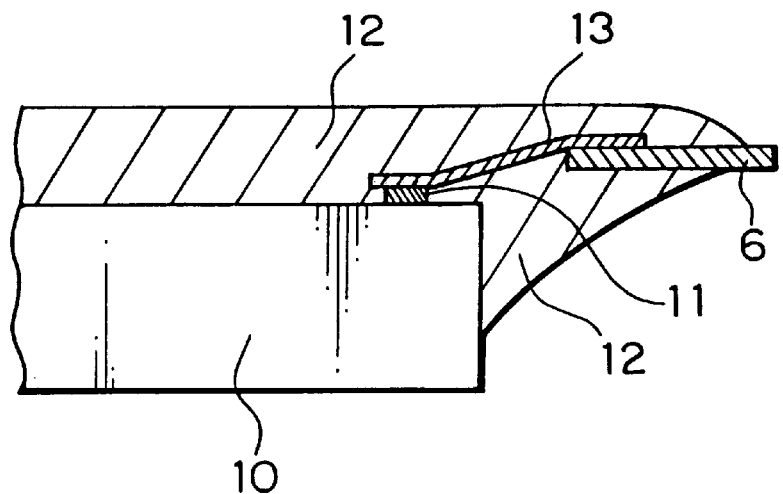
FIG. 3 is a sectional view taken in the direction of the long side of a device hole to show the main part of the first embodiment.
Figure 4:
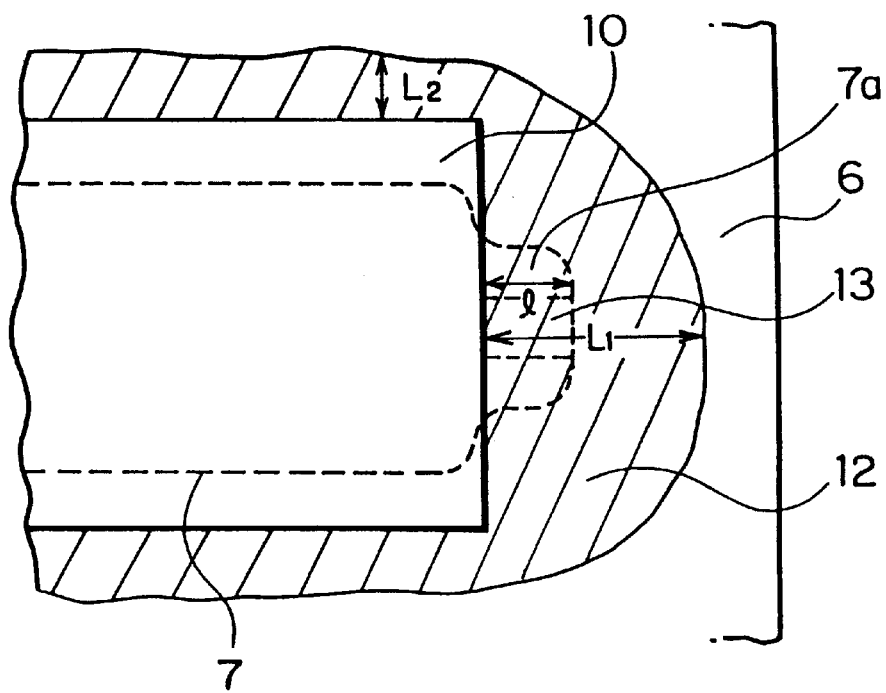
FIG. 4 is a plan view of the bottom face of a film carrier tape to show the main part of the first embodiment.

FIG. 1 is a plan view schematically showing the structure of UNT according to a fist embodiment of the invention. FIG. 2 is a sectional view showing the structure of the connection between a semiconductor chip and an inner lead. FIG. 3 and FIG. 4 are an enlarged sectional view of the main part of the first embodiment and a plan view of the bottom face of a film carrier tape. In FIG. 3 and FIG. 4, it is to be understood that a solder resist layer is omitted for simplification of the drawings.

In these drawings, reference numeral 6 shows a film carrier tape (thickness of 50 to 125 μm) of polyimide resin or the like. This film carrier tape 6 has slit-shaped device hole 7, which has a shorter length in a direction of the short sides than a length in a direction of the long sides of the film carrier tape 6. The device hole 7 has a projection 7a in the neighborhood of the middle of its each short side in the shape of substantially a semicircle with a part of the short side as its diameter.

A wiring layer 8, which is made of Cu, a Cu based alloy, a Ni—Fe based alloy or the like, is formed on one face (the upper face in the drawing) of the film carrier tape 6. The wiring layer 8 comprises input leads 8a, output leads 8b and inner leads 9 connected to the input and output leads. The inner leads 9 are formed to protrude their leading ends from the long sides of the device hole 7.

A semiconductor chip 10, which has a length of its short sides longer than that of the corresponding short sides of the device hole 7 and a length of its long sides shorter than that of the long sides of the device hole 7 including the projections 7a, is disposed with the electrode-pad-formed face upward in a region, where the device hole 7 is formed, of the film carrier tape 6. The electrode pads (not shown) and the leading ends of the inner leads 9 are connected with a Au bumps 11 formed on the electrode pads (inner lead bonding).

A resin-encapsulating layer 12 of epoxy resin is coated by a method of dispensing and applying a liquid resin to cover the electrode-pad-formed face of the semiconductor chip 10 and the connections of the semiconductor chip 10 and the inner leads 9. The resin-encapsulating layer 12 formed on the lower face of the film carrier tape 6 is largely expanded externally on the short sides of the device hole 7 and the semiconductor chip 10 as compared with the long sides thereof. Namely, when it is assumed that an expanded length of the resin-encapsulating layer 12 on the lower face of the film carrier tape 6 is $L_1$ on the short sides and $L_2$ on the long sides of the device hole 7, $L_1$ is larger than $L_2$. Reference numeral 13 in the drawings shows a dummy lead for mechanically supporting to fix the semiconductor chip 10. Reference numeral 14 denotes a solder resist layer coated to protect the wiring layer 8 of the film carrier tape 1. And, reference numeral 15 shows a slit-shaped outer lead hole.

The configuration of the first embodiment will be described more specifically in terms of numerical values. In the first embodiment, the film carrier tape 6 has a length of 35 mm in its breadth direction (horizontal direction in FIG. 1), the device hole 7 has a length of 0.7 mm×17 mm (short side×long side), and the semicircular projection 7a formed on the short sides of the device hole 7 has a projected length l of 200 to 300 μm from the end face of the semiconductor chip 10. The semiconductor chip 10 having external dimensions (short side×long side) of 0.9 mm×17 mm is mounted on the film carrier tape 6. The resin-encapsulating layer 12 is formed by dispensing a cold-setting epoxy resin (a viscosity of 10 to 20 Pa·s). The resin-encapsulating layer 12 formed on the lower face of the film carrier tape 6 has an expanded length L of about 200 μm on the long sides ($L_2$) of the semiconductor chip 10, while it is very large to 500 μm on the short sides ($L_1$).

In the semiconductor device of the first embodiment configured as described above, the device hole 7 of the film carrier tape 6 has a projection formed in the flat shape of substantially a semicircular in the neighborhood of its each short side. Therefore, a length along the long side of the device hole 7 including the projection 7a is larger than a length of the corresponding long side of the semiconductor chip 10. The expanded length of the resin-encapsulating layer 12 formed on the lower face of the film carrier tape 6 is larger on the short side of the semiconductor chip 10 than on the long side. Thus, a strength of adhesive of the resin-encapsulating layer 12 is extensively increased from the conventional 2 N m$^2$ on the short side of the semiconductor chip 10. Therefore, the resin-encapsulating layer 12 is not cracked in the steps of die-cutting and folding of the tape in order to mount on the mother board, and the semiconductor chip 10 has a good electrical connection with the inner leads 9.

Embodiment 2

Figure 5:
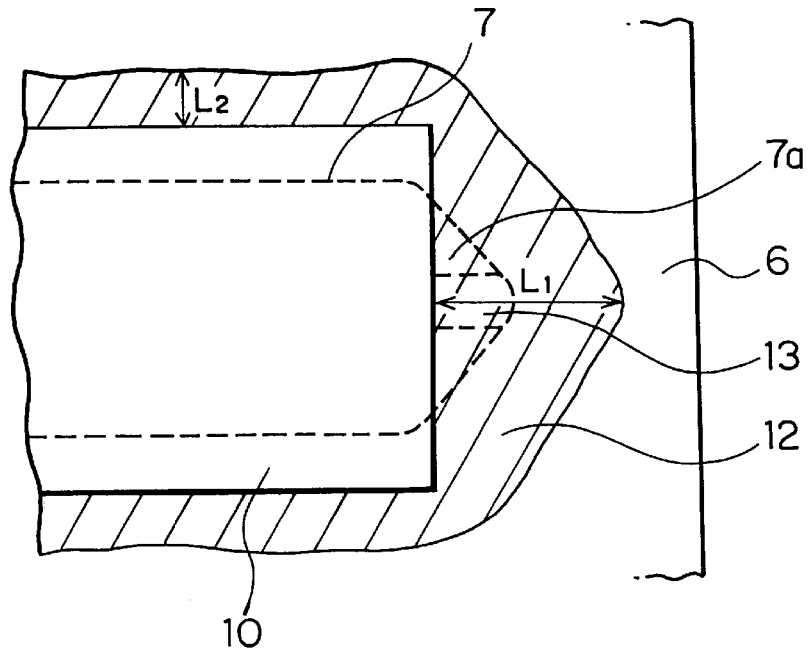
FIG. 5 is a plan view of the bottom face of a film carrier tape to show the main part of a second embodiment of the invention.

In a second embodiment on the semiconductor device according to the invention, the device hole 7 of the film carrier tape 6 has the projection 7a protruded externally in the neighborhood of the middle on both the short sides, and the projection 7a has the flat shape of a triangle with the full length of the short side of the device hole 7 as the base side of this triangle as shown in FIG. 5. The expanded length L of the resin-encapsulating layer 12 on the lower face of the film carrier tape 6 is extensively large on the short sides of the device hole 7 and the semiconductor chip as compared with that on the long sides ($L_1>L_2$), and the expanded length in the neighborhood of the middle on the short sides is larger than its both sides. Description on other parts will be omitted because they are configured in the same way as in the first embodiment.

In the semiconductor device of the second embodiment configured as described above, the device hole 7 of the film carrier tape 6 has externally projected parts on the short sides in such a way that its length along the long sides is longer than that of the corresponding long sides of the semiconductor chip 10. The expanded length of the resin-encapsulating layer 12 on the lower face of the film carrier tape 6 is extensively increased on the short sides of the semiconductor chip 10 as compared with that on the long sides. Therefore, a strength of adhesive of the resin-encapsulating layer 12 on the short sides of the semiconductor chip 10 is extensively increased as compared with the conventional UNT, and the resin-encapsulating layer 12 is not cracked in the steps of die-cutting and folding of the tape in order to mount on the mother board.

Embodiment 3

Figure 6:
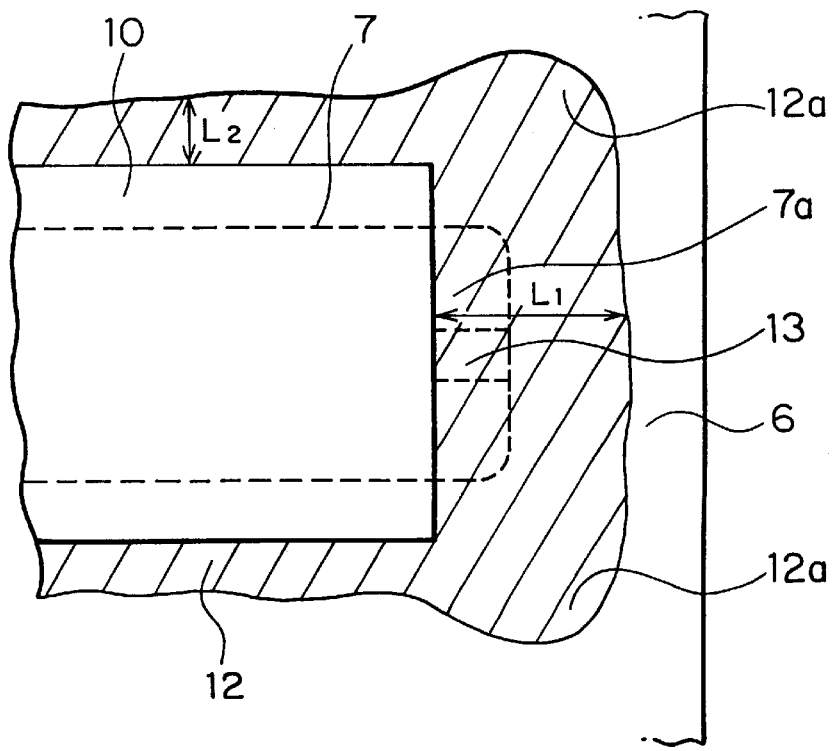
FIG. 6 is a plan view of the bottom face of a film carrier tape to show the main part of a third embodiment of the invention.

As shown in FIG. 6, in a third embodiment, the flat shape of the device hole 7 of the film carrier tape 6 has the same rectangular shape as ever but its length along the long sides only is larger than that of the corresponding long sides of the semiconductor chip 10. Namely, the projection 7a having a square flat shape with the full length of the short side as its one side is formed in the neighborhood of the middle on both the short sides of the device hole 7. With the increase in length of the long sides of the device hole 7, the expanded length L of the resin-encapsulating layer 12 on the lower face of the film carrier tape 6 is extensively increased on the short sides of the device hole 7 and the semiconductor chip 10 as compared with that on the long sides ($L_1>L_2$), and swelled portions 12a are formed on four corners. Description on other parts will be omitted because they are configured in the same way as in the first embodiment.

In the semiconductor device of the third embodiment described above, the device hole 7 of the film carrier tape 6 has externally projected portions on the short sides such that its length along the long sides is longer than that of the corresponding long sides of the semiconductor chip 10. The expanded length of the resin-encapsulating layer 12 on the lower face of the film carrier tape 6 is extensively increased on the short sides of the semiconductor chip 10 as compared with that on the long sides. Therefore, a strength of adhesive of the resin-encapsulating layer 12 on the short sides of the semiconductor chip 10 is extensively increased as compared with the existing UNT, and the resin-encapsulating layer 12 is not cracked in the steps of die-cutting and folding of the tape in order to mount on the mother board.

Figure 7A:
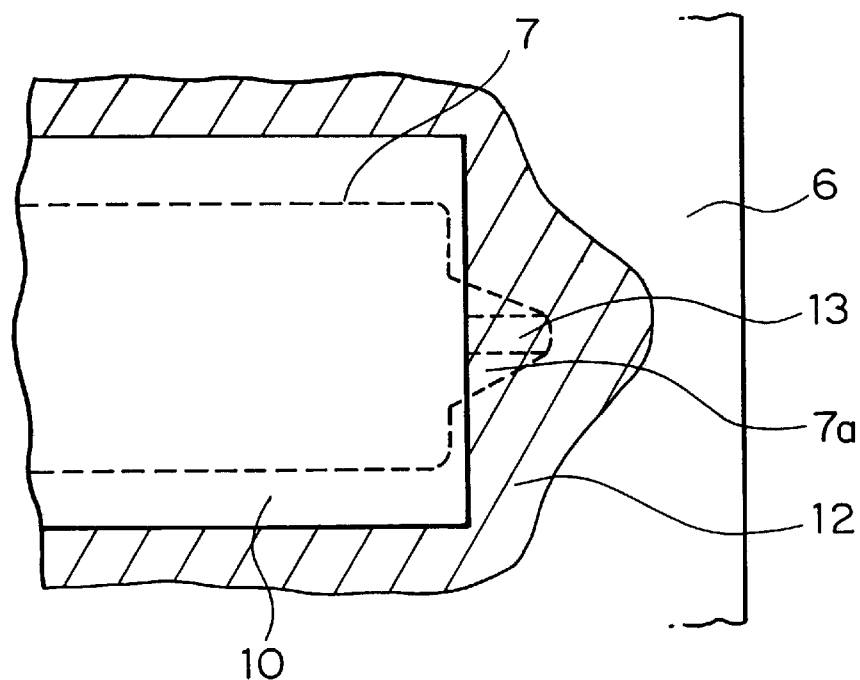
FIG. 7A and FIG. 7B are plan views of the bottom faces of film carrier tapes to show the main parts of fourth and fifth embodiments of the invention respectively.
Figure 7B:
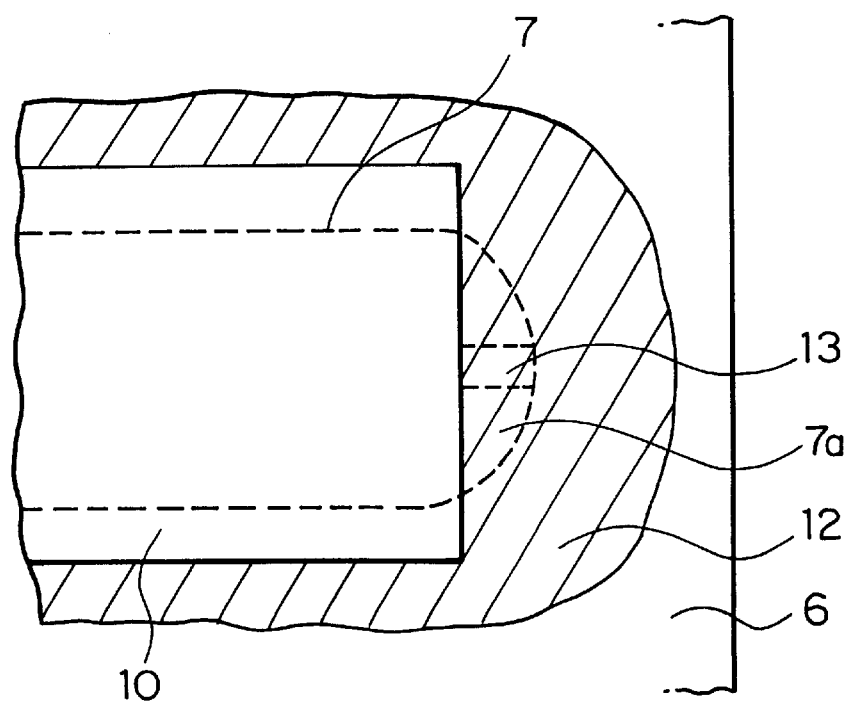
Figure 8A:
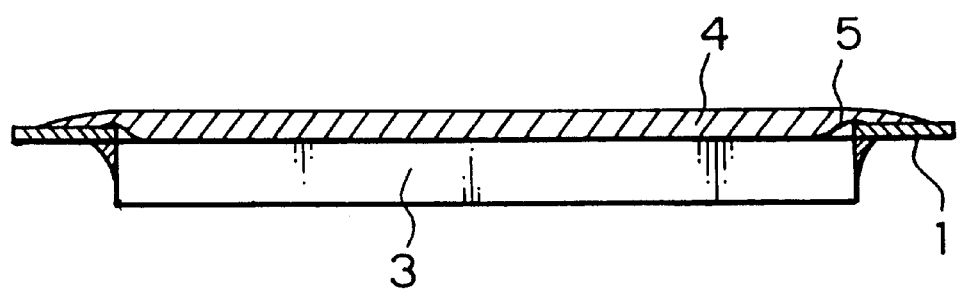
FIG. 8A and FIG. 8B are a sectional view of a device hole in the direction of its long side and a plan view of the bottom face of an insulating resin film, to show the structure of a conventional UNT.
Figure 8B:
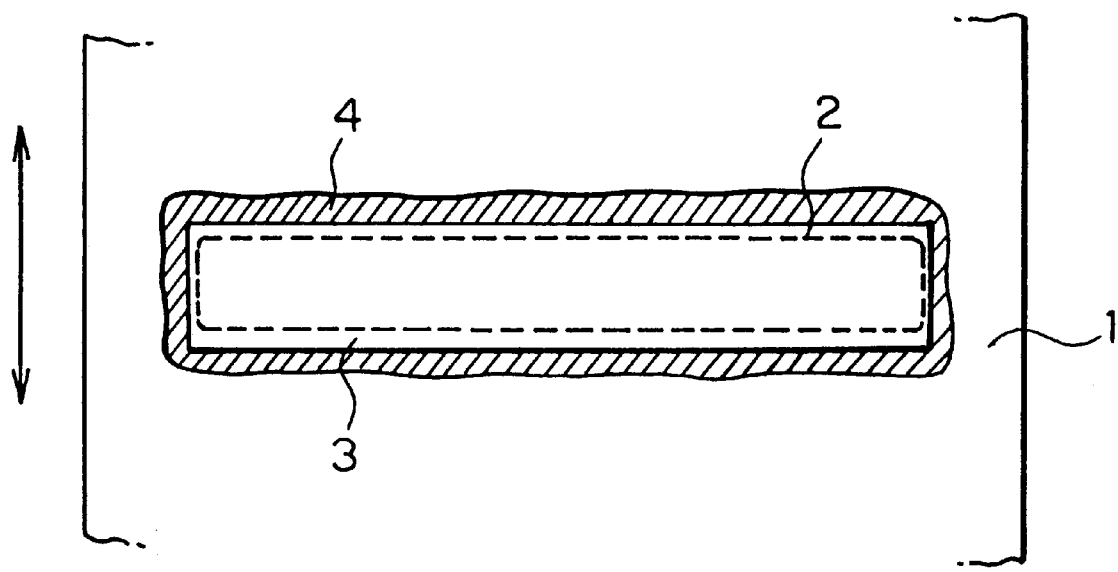

The invention is not limited to the embodiments described above and may be modified in various ways without departing from the spirit and the scope of the invention. For example, the flat shape of the projection 7a formed in the neighborhood of the middle on the short side of the device hole 7 of the film carrier tape 6 can have the shape of a triangle with one part of the short side of the device hole 7 as the base side as shown in FIG. 7A, or a semicircle or arc with the full length of the short side of the device hole 7 as the diameter or chord as shown in FIG. 7B to achieve the same effects as in the first to third embodiments described above.

As apparent from the description above, in the semiconductor device of the present invention, the length along the long side of the device hole formed on the insulating film is determined to be larger than that of the corresponding long side of the semiconductor element, and the length of the expansion of the resin-encapsulating layer on the short sides of the semiconductor element is larger than that on the long side. Therefore, a strength of adhesive of the resin-encapsulating layer is highly enhanced on the short side over that in the conventional UNT. When such a semiconductor device is mounted on the mother board, the resin-encapsulating layer is not cracked in the steps of die-cutting and folding of the tape, and the reliability of connection of the semiconductor element is improved.

What is claimed is:

1. A semiconductor device, comprising:

an insulating film having a device hole;

inner leads, which are disposed on one main face of the insulating film with their leading ends protruded to the device hole;

a semiconductor element, which is mounted on the device hole region of the insulating film and has its electrode pads electrically connected to the ends of the inner leads; and a resin-encapsulating layer for covering the semiconductor element, the inner leads and the connection of the semiconductor element and the inner lead, wherein:

a length of the device hole along its long side is determined to be larger than that of the corresponding long side of the semiconductor element, and resin-encapsulating layer coated on the insulating film is largely expanded externally on the short side of the device hole as compared with that on the long side.

2. The semiconductor device according to claim 1, wherein a length of the device hole along the long side only is larger than that of the long side of the semiconductor element, and a length along the short side is smaller than that of the corresponding short side of the semiconductor element.

3. The semiconductor device according to claim 1, wherein the device hole has a flat shape with a projection externally protruded in the neighborhood of the middle on the short side.

4. The semiconductor device according to claim 3, wherein the projection formed on the short side of the device hole has a flat triangle or square shape with a part of the short side of the device hole as one side thereof.

5. The semiconductor device according to claim 3, wherein the projection formed on the short side of the device hole has a flat semicircular or arc shape with a part of the short side of the device hole as the diameter or chord thereof.

6. The semiconductor device according to claim 3, wherein the projection formed on the short side of the device hole has a flat triangle or square shape with the full length of the short side of the device hole as one side thereof.

7. The semiconductor device according to claim 3, wherein the projection formed on the short side of the device hole has a flat semicircular or arc shape with the full length of the short side of the device hole as the diameter or chord thereof.

8. The semiconductor device according to claim 1, wherein the insulating film is a polyimide resin film.

9. The semiconductor device according to claim 1, wherein the resin-encapsulating layer is an epoxy resin-encapsulating layer.

* * * * *